United States Patent
Lum et al.

(10) Patent No.: US 7,612,322 B2
(45) Date of Patent: Nov. 3, 2009

(54) TEMPERATURE-COMPENSATED HIGH DYNAMIC RANGE OPTICAL RECEIVER

(75) Inventors: Richard Kok Keong Lum, Singapore (SG); Lei Chen, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 91 days.

(21) Appl. No.: 11/675,486

(22) Filed: Feb. 15, 2007

(65) Prior Publication Data

US 2008/0197271 A1 Aug. 21, 2008

(51) Int. Cl.
*G01J 1/44* (2006.01)
*H03F 3/08* (2006.01)
*H04B 10/06* (2006.01)

(52) U.S. Cl. .............. 250/214 R; 250/214 A; 398/209

(58) Field of Classification Search ........... 250/214 R, 250/214 A, 214 LS, 214.1, 214 LA, 214 AG, 250/214 AL, 214 B, 214 C; 398/209, 202; 330/278, 282, 284, 285, 296, 308; 327/511, 327/514, 515; 348/294, 295, 297

See application file for complete search history.

(56) References Cited

U.S. PATENT DOCUMENTS

| 5,361,637 | A | * | 11/1994 | Judd et al. ............ 73/766 |
| 2007/0086791 | A1 | * | 4/2007 | Noya et al. .......... 398/202 |
| 2008/0101803 | A1 | * | 5/2008 | Lum et al. .......... 398/209 |

* cited by examiner

*Primary Examiner*—Georgia Y Epps
*Assistant Examiner*—Don Williams

(57) ABSTRACT

A light sensor having a photocurrent subsection and an interface circuit is disclosed. The photocurrent subsection includes a photodetector, an amplifier, a diode and an impedance element. The first photodetector generates a current between a first node and a power rail in response to being illuminated with light. The interface circuit generates an output signal that is related to the logarithm of the intensity of light that is incident on the photodetector. The impedance element is constructed in a manner that compensates for the thermal dependency of the impedance through the diode. Additional photocurrent subsections can be added to further reduce the thermal dependency of the output signal.

8 Claims, 6 Drawing Sheets

TEMPERATURE-COMPENSATED HIGH DYNAMIC RANGE OPTICAL RECEIVER

BACKGROUND OF THE INVENTION

Optical receivers are used in a large number of light sensing applications. The receiver typically includes a photodetector that is illuminated by a light signal and generates a current that is related to the intensity of the light. This current is converted to a voltage by an interface circuit to provide an output signal that is utilized by an apparatus connected to the optical receiver.

In some light sensing applications, an output signal that is proportional to the logarithm of the light intensity is particularly useful. For example, the apparatus that is processing the output signal may need to compute the product or ratio of two light signals. This computation can be performed on the logarithmic signals using simple addition or subtraction circuits.

In other light sensing applications, the amplitude of the light signal can vary by a factor of more than 100,000. Providing an output signal that is proportional to the intensity of light in these situations is not practical, since the circuitry that processes the light signals has a fixed maximum potential and sensitivity. If the circuitry is set to provide the maximum output at the highest intensity, then the sensitivity of the circuitry at the lowest light levels is insufficient. In this regard, it should be noted that many circuit elements have intrinsic noise that overwhelms very small signals. If, on the other hand, the circuits are designed to provide adequate sensitivity at the low light levels, the circuits will saturate at the high light levels and differences in intensity levels at high light intensities cannot be measured. One solution to this problem is to provide an output signal that is related to the logarithm of the light intensity. Such a signal provides the required sensitivity at all light levels.

SUMMARY OF THE INVENTION

The present invention includes a light sensor having a first photocurrent subsection and an interface circuit. The first photocurrent subsection includes a first photodetector, a first amplifier, a first diode and a first impedance element. The first photodetector generates a current between a first node and a power rail in response to being illuminated with light. The first amplifier has an input connected to the first node and an output connected to a second node, the amplifier maintaining the first node at a first constant reference potential. The first diode is connected between the first and second nodes, the first diode providing an impedance characterized by a first thermal coefficient of impedance. The first impedance element is connected between the second node and a third node, the first impedance element is characterized by a second thermal coefficient of impedance. The interface circuit maintains the third node at a second constant reference potential and generates an output signal determined by an input current entering the interface circuit from the third node. The first and second thermal coefficients of impedance are chosen to reduce the thermal dependency of the output signal while providing an output signal that is related to the logarithm of the intensity of light striking the first photodiode. Additional photocurrent subsections can be added to further reduce the thermal dependency of the output signal.

DETAILED DESCRIPTION OF EMBODIMENTS OF THE PRESENT INVENTION

Figure 1:
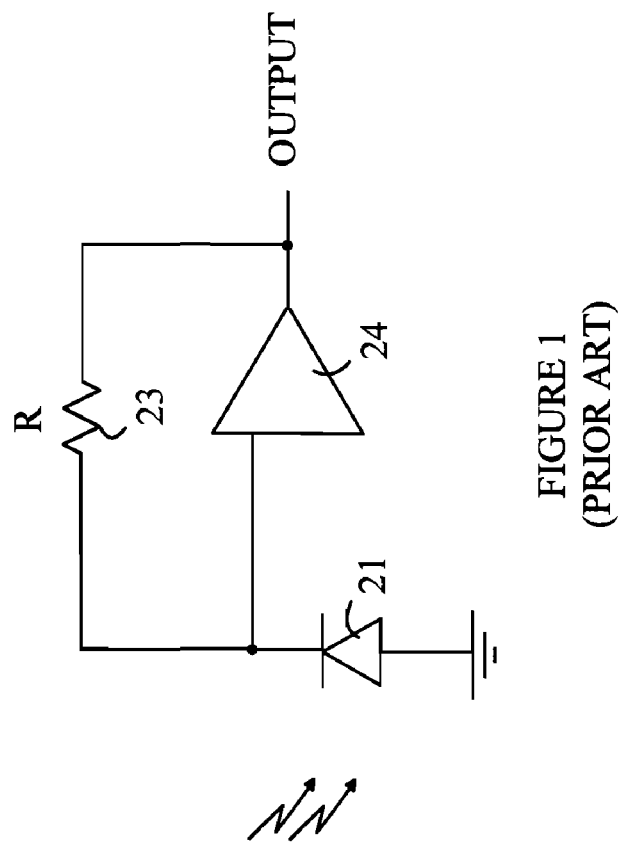
FIG. 1 is a prior art schematic diagram of a photodiode connected to a conventional transimpedance amplifier (TIA).

The manner in which the present invention provides its advantages can be more easily understood with reference to FIG. 1, which is a prior art schematic diagram of a photodiode connected to a conventional transimpedance amplifier (TIA). When photodiode 21 is illuminated, a current flows through photodiode 21 and the output of amplifier 24 increases until the same amount of current flows through feedback resistor 23. There is a maximum output voltage that the amplifier can provide. If the feedback resistor is set to provide this output voltage for the highest anticipated value of the photocurrent in photodiode 21, then the sensitivity of the circuit at very low light levels can be insufficient for many applications. Conversely, if the resistance is set at a value that provides high sensitivity at low light levels, the amplifier will saturate at higher levels.

In principle, this problem can be overcome by replacing resistor 23 with a circuit that changes impedance as the photocurrent changes. The impedance would decrease as the photocurrent increases, thereby providing high sensitivity at low light levels while preventing the amplifier from saturating at high light levels. In such a TIA, the output signal would now be a non-linear function of the illumination level; however, the output would have the desired dynamic range.

Figure 2:
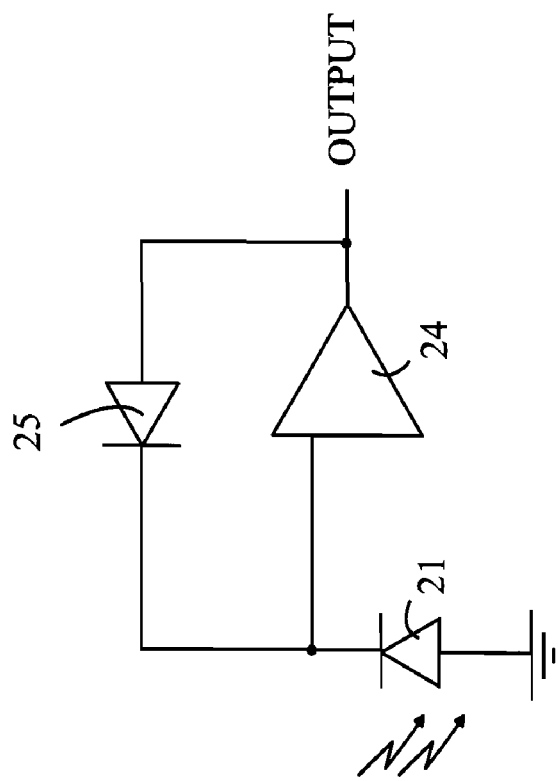
FIG. 2 is a schematic diagram of a photodiode connected to a TIA that utilizes a diode to provide the variable resistance in question.

Refer now to FIG. 2, which is a schematic diagram of a photodiode connected to a TIA that utilizes a diode to provide the variable resistance in question. Diode 25 replaces resistor 23 in the circuit shown in FIG. 1. Otherwise the circuit functions in an analogous manner. Since the current through diode 25 is an exponential function of the potential across the diode, the output of amplifier 24 will now be a function of the logarithm of the photocurrent.

Unfortunately, the impedance of diode 25 changes with temperature, and hence, the output of the circuit shown in FIG. 2 also changes with temperature. In many applications of interest, the light sensor must operate in an environment in which the temperature changes significantly from the temperature at which the light sensor was calibrated.

Figure 3:
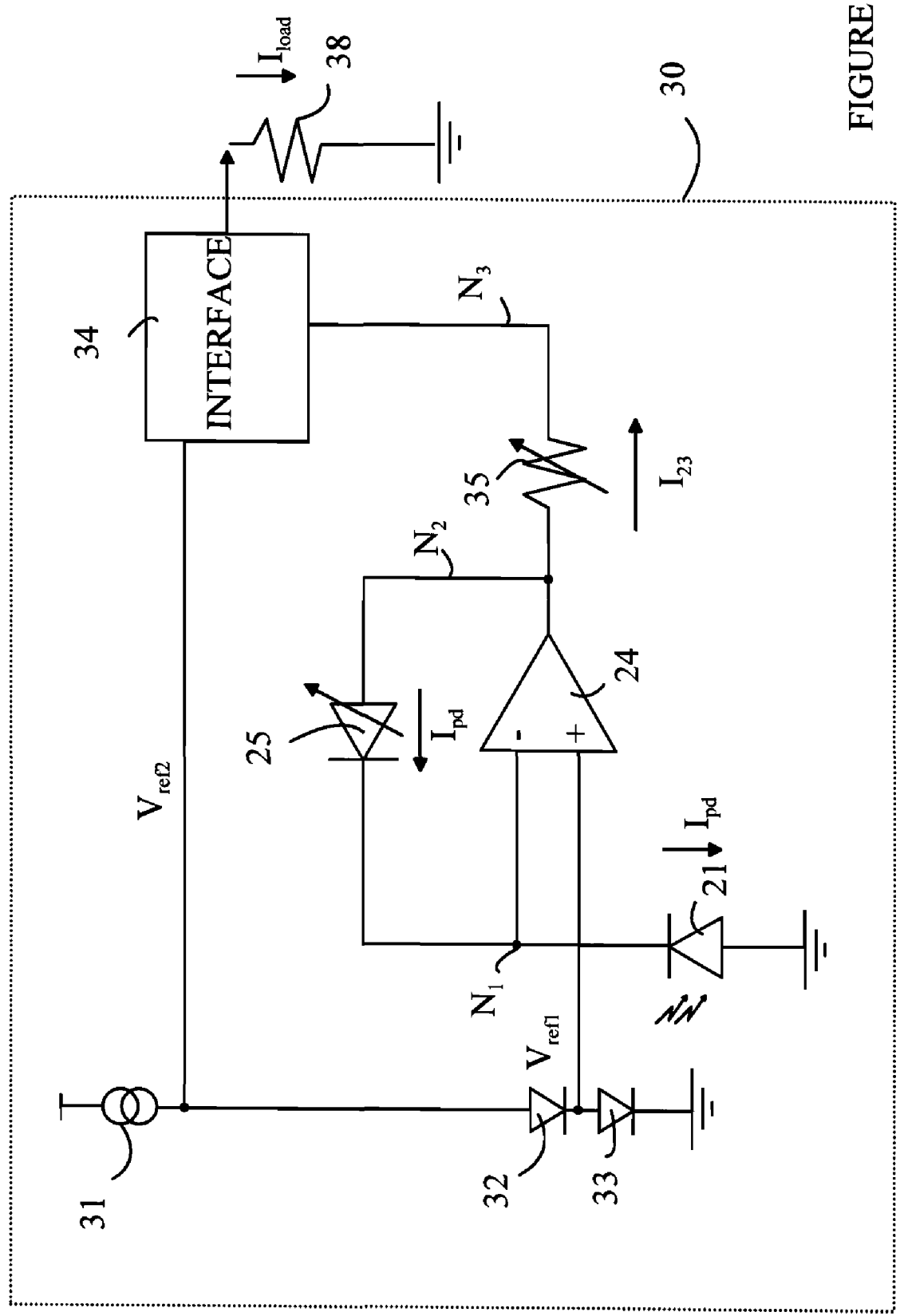
FIG. 3 is a simplified schematic drawing of a light sensor 30 according to one embodiment of the present invention.

The manner in which the present invention provides a current that is related to the log of the current through photodiode 21 and that is independent of temperature changes can be more easily understood with reference to FIG. 3, which is a simplified schematic drawing of a light sensor according to one embodiment of the present invention. Light sensor 30 provides a current $I_{load}$ into a load in which $I_{load}$ is proportional to the logarithm of the intensity of light on photodiode 21.

Light sensor 30 utilizes a temperature compensated current source 31 to generate 2 temperature compensated reference voltages $V_{ref1}$ and $V_{ref2}$. $V_{ref1}$ and $V_{ref2}$ are generated with the aid of diodes 32 and 33. It is assumed that diodes 32 and 33 have the same temperature coefficients, and hence, $V_{ref1}$ remains set at a constant fraction of $V_{ref2}$ independent of temperature fluctuations.

$V_{ref1}$, in turn, sets the potential at node $N_1$, and hence, node $N_1$ remains at a constant potential independent of the current $I_{pd}$ that flows through photodiode 21. Amplifier 24 provides the current through photodiode 21 by increasing the potential at node $N_2$ until node $N_1$ reaches the constant potential determined by $V_{ref1}$. The potential at node $N_2$ can be written in the form $$V_2 = V_{25} + V_1, \quad (1)$$

where $V_{25}$ is the potential difference across diode 25, $V_2$ is the potential at node $N_2$, and $V_1$ is the potential at node $N_1$. The potential across diode 25 can be written in the form $V(T) \ln(I_{pd}/I_0)$ where $V(T)$ depends on the temperature, T, but not the current through diode 25. Hence, Eq. (1) can be rewritten as follows:

$$V_2 = V(T) \ln(I_{pd}/I_0) + V_1, \quad (2)$$

As will be explained in more detail below, interface circuit 34 holds node $N_3$ at a constant potential $V_3$. Hence, $$V_2 = I_{23} R_{35} + V_3, \quad (3)$$

where $R_{35}(T)$ the impedance of element 35 and $I_{23}$ is the current flowing between nodes $N_2$ and $N_3$.

$$I_{23} R_{35} + = V(T) \ln(I_{pd}/I_0) + (V_1 - V_3). \quad (4)$$

To first order, $$V(T) = V_0(1 + a(T - T0))$$

and $$R_{35}(T) = R_0(1 + b(T - T0)), \quad (5)$$

where $V_0$ and $R_0$ are constants that do not depend on temperature. Hence, if $V_1 = V_3$ and $a = b$, then $I_{23}$ will be proportional to $\ln(I_{pd}/I_0)$ and will not vary with temperature to first order.

Interface circuit 34 will be discussed in more detail below. For the purposes of the present discussion, it is sufficient to note that interface circuit 34 performs two functions in light sensor 30. First, interface circuit 34 maintains node $N_3$ at $V_3$ independent of the magnitude of $I_{23}$. Second, interface circuit 34 generates a current $I_{load}$ in load 38 that is proportional to $I_{23}$.

The embodiments of the present invention discussed above depend on having an impedance element that has the same temperature coefficient as diode 25. In general, resistors that can be fabricated with conventional semiconductor processing do not have a sufficiently high coefficient of thermal resistivity to provide the desired impedance element. Transistors operating in triode region as resistors can provide a higher coefficient of thermal resistivity. Hence, an impedance element constructed from the parallel combination of a transistor and a resistor can provide the desired temperature coefficient, if the relative impedances of the resistor and transistor are set properly.

Figure 4:
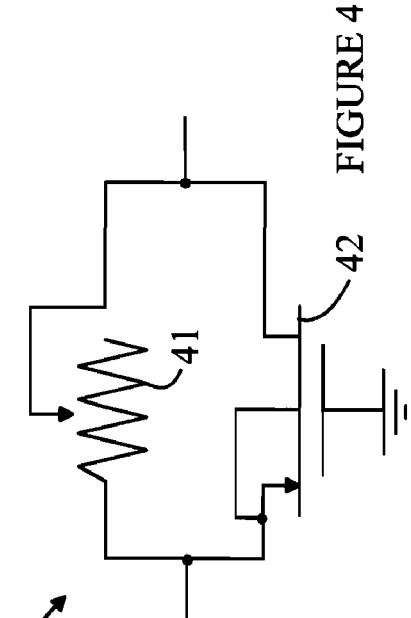
FIG. 4 illustrates an impedance element that is suitable for use in light sensor 30.

Refer now to FIG. 4, which illustrates an impedance element that is suitable for use in light sensor 30. Impedance element 40 includes a variable resistor 41 in parallel with a transistor 42 having its base held at ground. By adjusting the resistance of the variable resistor, an impedance element that has a temperature characteristic that approximates that of diode 25 shown in FIG. 3 to first order can be obtained.

Figure 5:
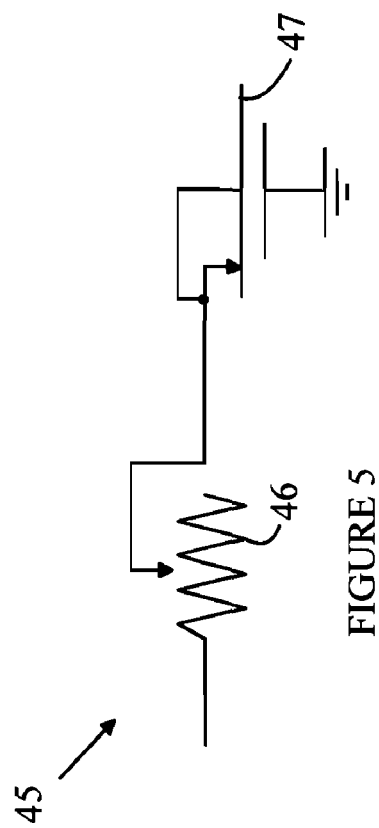
FIG. 5 illustrates another embodiment of an impedance element for use in the present invention.

Similarly, a series combination of the two elements can be utilized to provide the desired impedance element as shown in FIG. 5, which illustrates another embodiment of an impedance element for use in the present invention. Impedance element 45 consists of the series combination of a variable resistor transistor 47. By adjusting the width length ratio of transistor 47 and the resistance of resistor 46, an element that matches the temperature behavior of diode 25 to first order can also be obtained.

Figure 6:
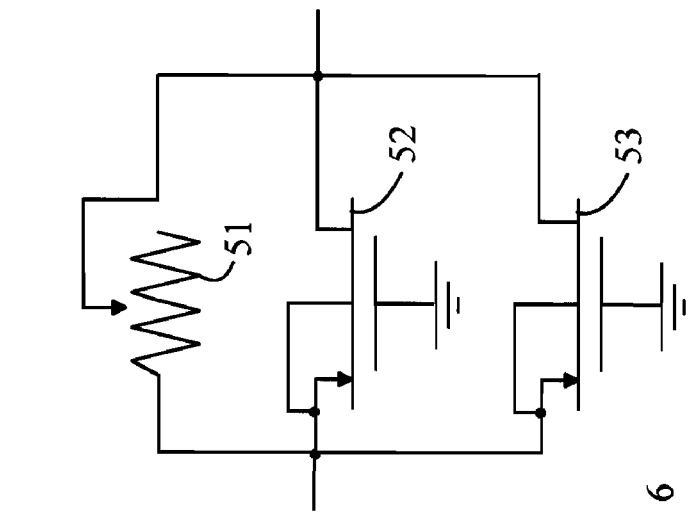
FIG. 6 illustrates another embodiment of an impedance element for use in the present invention.

If a better match between the temperature dependence of impedance element 35 and that of diode 25 is needed, more complex embodiments of impedance element 35 could be utilized. For example, PMOS transistor 42 shown in FIG. 4 could be replaced by a parallel combination of PMOS transistors in which the individual transistors have different width to length ratios. Refer now to FIG. 6, which illustrates another embodiment of an impedance element that could be utilized for impedance element 35. Impedance element 50 utilizes a resistor 51 in parallel with two PMOS transistors 52 and 53. The width to length ratio of transistor 52 is different from that of transistor 53, and hence, the transistors have different thermal coefficients.

Figure 7:
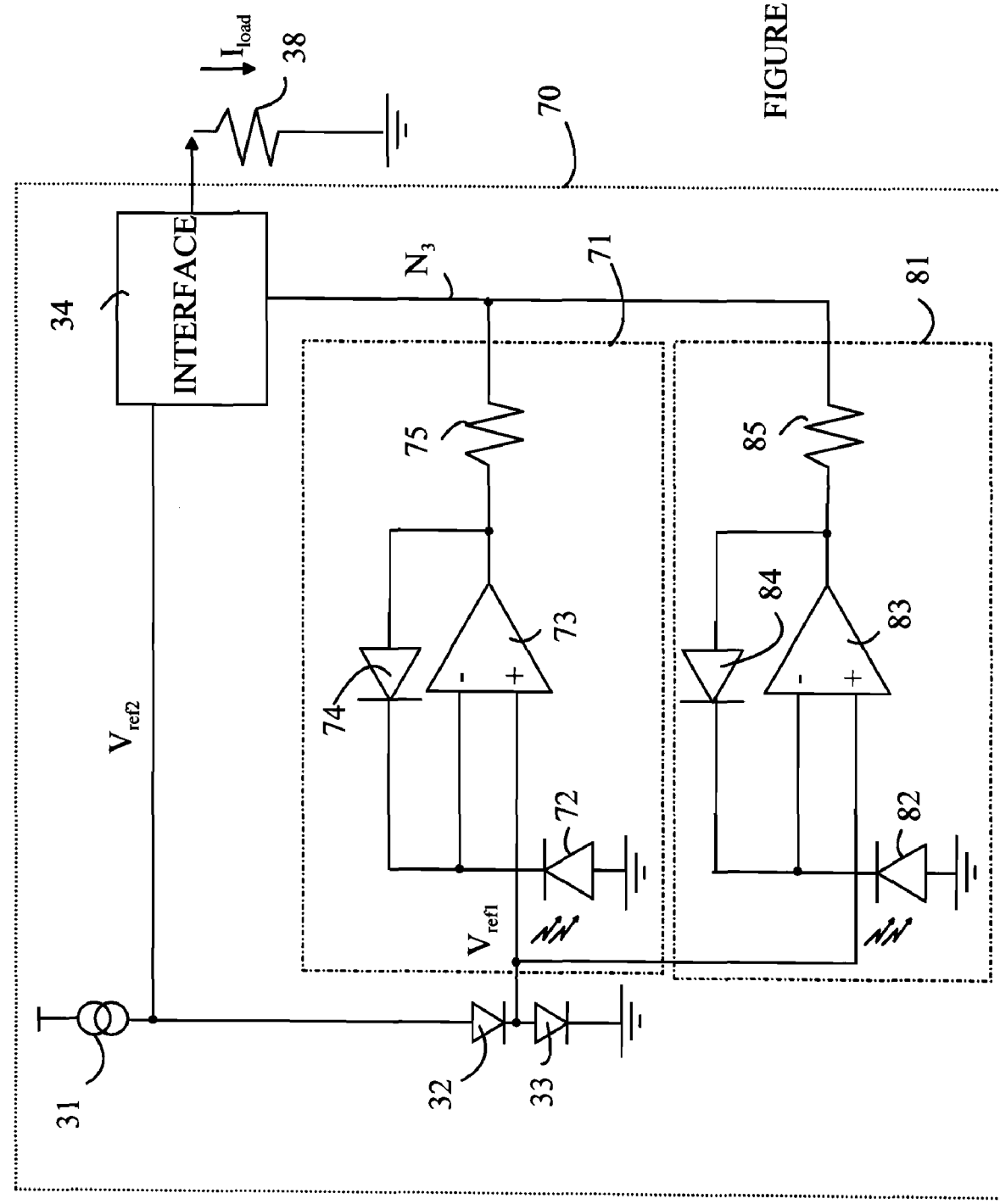
FIG. 7 illustrates a light sensor according to another embodiment of the present invention.

Additional temperature compensation can be provided by utilizing a plurality of photodiode subsystems that utilize diodes and impedance elements having different temperature characteristics. Refer now to FIG. 7, which illustrates a light sensor according to another embodiment of the present invention. Light sensor 70 utilizes two photodiode sub-sections 71 and 81. Each sub-section includes a photodiode, feedback diode, amplifier, and impedance element having an impedance that varies with temperature. The impedance elements in sub-sections 71 and 81 are shown at 75 and 85, respectively. The photodiodes in sub-sections 71 and 81 are shown at 72 and 82, respectively. The feedback diodes in sub-sections 71 and 81 are shown at 74 and 84, respectively. The amplifiers in sub-sections 71 and 81 are shown at 73 and 83, respectively. The output currents from each of the sub-sections are summed at node $N_3$ before entering interface circuit 34. The temperature coefficients of feedback diodes 74 and 84 are different from one another and are chosen to provide better overall temperature compensation. The temperature coefficients of impedance elements 75 and 85 are matched to those of feedback diodes 74 and 84, respectively, in a manner analogous to that described above.

The gain of the light sensor can be adjusted by altering parameters at a number of locations within the light source. For the purposes of this discussion, the gain of the light sensor is defined to be the magnitude of the current $I_{load}$ into the load per unit of intensity in the light incident on the photodiode, or photodiodes at some predetermined intensity. The current is determined by the magnitude of the current delivered to interface circuit 34 and the gain of interface 34. The gain provided by interface circuit 34 will be discussed in more detail below. The magnitude of the current delivered to interface circuit 34 is inversely proportional to the impedance of impedance element 35. Hence, the gain can be increased by utilizing a smaller impedance. The current is also proportional to the voltage difference between nodes $N_2$ and $N_3$ at the light intensity in question. The voltage at $N_2$ is determined by the area of the feedback diode. The reference voltage at $N_3$ is determined by the bias current generated by current source 31. Hence, changing the bias current or the areas of diodes 32 and 33 can also alter the gain of the light source.

Figure 8:
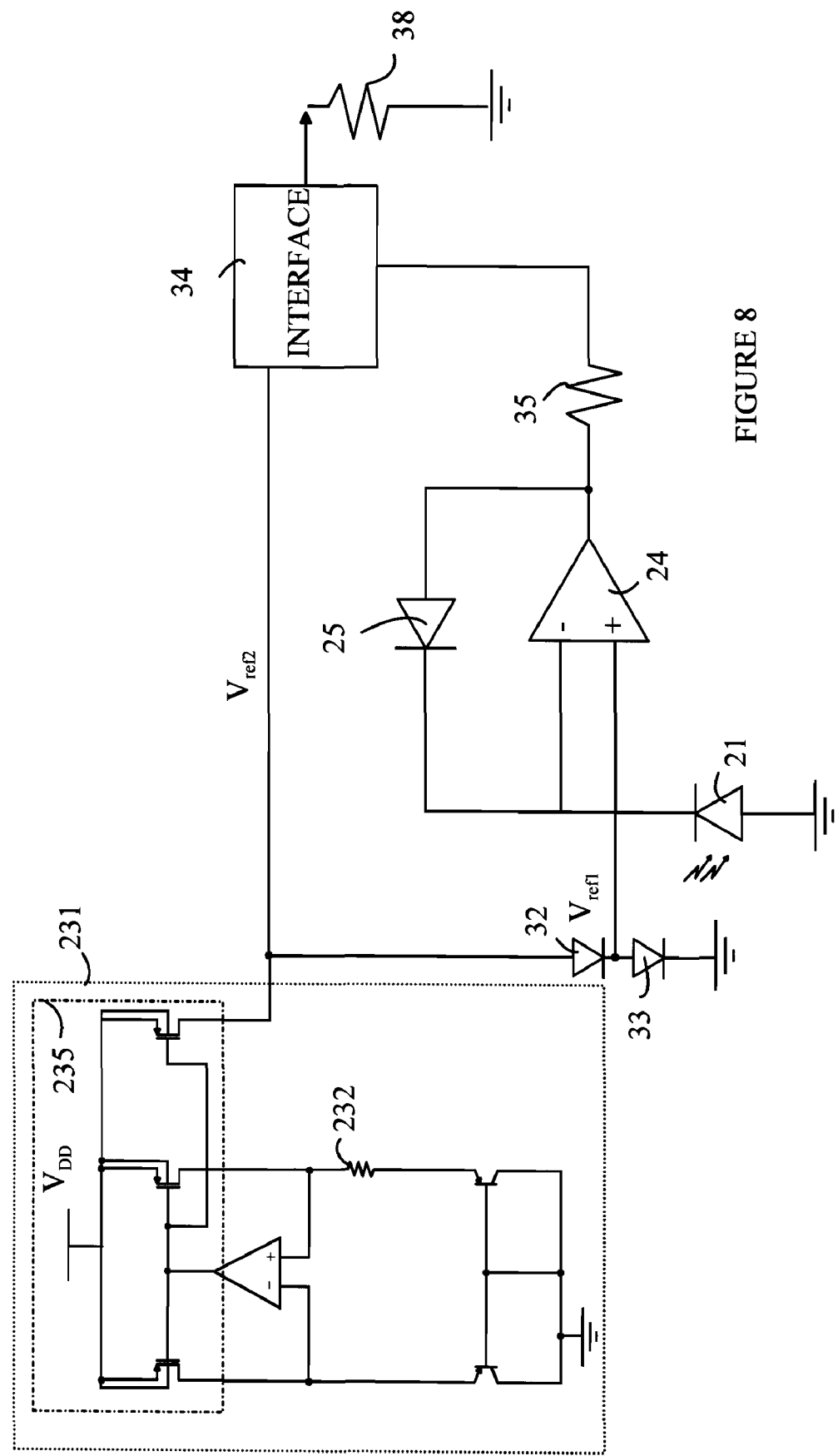
FIG. 8 is another embodiment of a light source according to the embodiments of the present invention shown in FIG. 3.

The above-described embodiments of the present invention utilize a temperature compensated current source 31 to provide the bias current that provides the reference signals utilized by the light sensor. Such circuits are conventional in the art, and hence, will not be discussed in detail. An exemplary current source 231 is shown in FIG. 8, which is a light source according to the embodiments of the present invention shown in FIG. 3 with a more detailed schematic of a temperature compensated current source 231. For the purposes of the present discussion, it should be noted that impedance element 232 is typically a combined element similar to impedance element 35 that compensates for changes in impedance that are a function of temperature in the other components. Hence, the current through impedance element 232 remains constant and is mirrored by the current mirror shown at 235.

Figure 9:
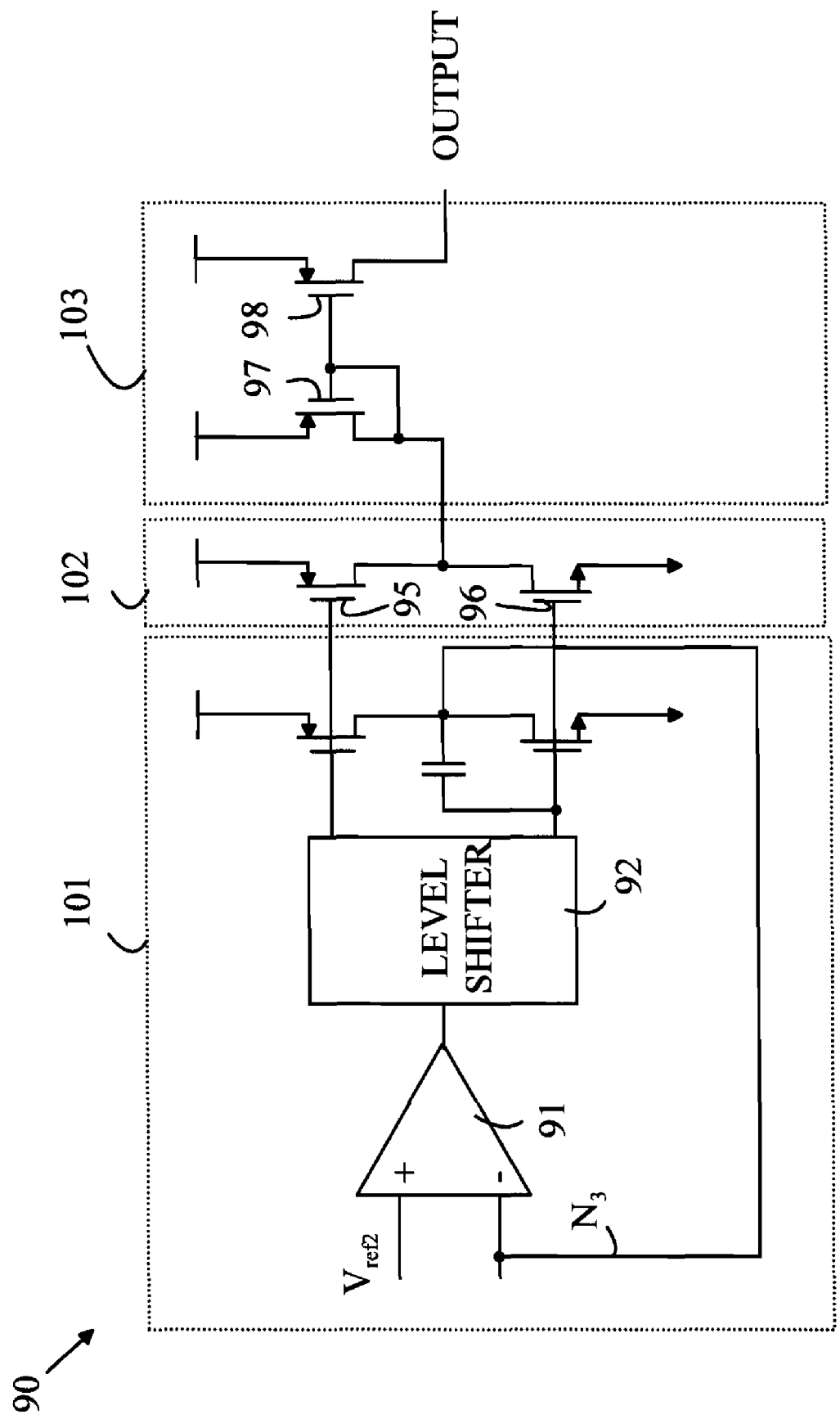
FIG. 9 is a schematic drawing of an interface circuit that can be utilized in the embodiments shown in FIGS. 3 and 7.

As noted above, interface circuit 34 provides two functions. First it maintains node $N_3$ at a constant potential independent of temperature, and second, it provides a current proportional to the current entering the interface circuit into load 38. Refer now to FIG. 9, which is a schematic drawing of an interface circuit that can be utilized in the embodiments shown in FIGS. 3 and 7. In embodiments such as those shown in FIG. 7, interface circuit 90 also provides the summing feature that combines the currents through impedance elements 75 and 85.

Interface circuit 90 can be viewed as a Miller amplifier having a common source output drivers 101, an output driver stage 102, and a current mirror 103 that provides an output current that is proportional to the current in the output driver stage 102 with the bias current subtracted. The Miller amplifier includes a gain stage 91 and a level shifter 92 that replicates the output of the gain stage at different offsets. The output driver stage consists of transistors 95 and 96. Transistors 97 and 98 mirror the current through transistor 96 subtracted by the bias current that flows through transistor 95 to provide the output current. The gain of the light sensor can also be altered by altering the ratio of the areas of transistors 97 and 98.

Refer again to FIG. 3. Ideally, the temperature behavior of impedance element 35 exactly matches that of diode 25 so that the light sensor has an output that does not vary with temperature. To first order, the temperature coefficient of impedance is a constant and the temperature coefficients can be matched to high accuracy. However, in practice, the temperature coefficient of impedance may be viewed as changing with temperature, and the changes may be different for impedance element 35 and diode 25. In this case the light sensor will still show some variation in output with temperature. However, the light sensor will still be an improvement over light sensors that do not have the temperature compensation of the present invention. In fact, an improvement will be provided if the temperature coefficient of impedance of element 35 has the same sign as that of diode 25 so that both elements either increase or decrease in impedance together.

Various modifications to the present invention will become apparent to those skilled in the art from the foregoing description and accompanying drawings. Accordingly, the present invention is to be limited solely by the scope of the following claims.

What is claimed is:

1. A light sensor comprising a first photocurrent subsection and an interface circuit, said first photocurrent subsection comprising:
   a first photodetector that generates a current between a first node and a power rail in response to being illuminated with light;
   a first amplifier having an input connected to said first node and an output connected to a second node, said amplifier maintaining said first node at a first constant reference potential;
   a first diode connected between said first and second nodes, said first diode providing an impedance characterized by a first thermal coefficient of impedance; and
   a first impedance element connected between said second node and a third node, said first impedance element being characterized by a second thermal coefficient of impedance; and
   an interface circuit that maintains said third node at a second constant reference potential and generating an output signal determined by an input current entering said interface circuit from said third node.

2. The light sensor of claim 1 wherein said first thermal coefficient of impedance is equal to said second thermal coefficient of impedance at a first temperature.

3. The light sensor of claim 1 wherein said first impedance element comprises a resistor and a transistor, said resistor having a thermal coefficient of impedance less than said first thermal coefficient of impedance and said transistor having a thermal coefficient of impedance greater than said first thermal coefficient of impedance.

4. The light sensor of claim 1 wherein said interface circuit comprises a Miller amplifier and a current mirror, said output signal being a current proportional to said input current.

5. The light sensor of claim 1 further comprising a reference signal generating circuit that generates said first and second constant reference potentials.

6. The light sensor of claim 5 wherein said reference signal generating circuit comprises a temperature compensated current source.

7. The light sensor of claim 1 further comprising a second photocurrent subsection comprising:
   a second photodetector that generates a current between a fourth node and a power rail in response to being illuminated with light;
   a second amplifier having an input connected to said fourth node and an output connected to a fifth node, said amplifier maintaining said fourth node at said first constant reference potential;
   a second diode connected between said fourth and fifth nodes, said second diode providing an impedance characterized by a third thermal coefficient of impedance; and
   a second impedance element connected between said fifth node and a sixth node, said first impedance element being characterized by a third thermal coefficient of impedance, wherein said interface circuit maintains said sixth node at said second constant reference potential and adds a current leaving said third node to a current leaving said sixth node to generate said output signal.

8. The light sensor of claim 7 wherein said second diode and said second impedance element are chosen such that said current entering said third node changes with temperature less than said current entering said third node from said first photocurrent subsection changes with temperature at a temperature within a predetermined operating range.

* * * * *